(12) United States Patent
Cai et al.

(10) Patent No.: US 6,417,541 B1
(45) Date of Patent: Jul. 9, 2002

(54) ESD PROTECTION NETWORK WITH FIELD OXIDE DEVICE AND BONDING PAD

(75) Inventors: Jun Cai; Keng Foo Lo, both of Singapore (SG)

(73) Assignee: Chartered Semiconductor Manufacturing LTD, Singapore (SG)

( * ) Notice: Subject to any disclaimer, the term of this patent is extended or adjusted under 35 U.S.C. 154(b) by 0 days.

(21) Appl. No.: 09/759,492

(22) Filed: Jan. 12, 2001

(51) Int. Cl.[7] .................... H01L 23/62; H01L 29/78
(52) U.S. Cl. .................... 257/328; 257/355; 257/356
(58) Field of Search ........................ 257/328, 355, 257/356

(56) References Cited

U.S. PATENT DOCUMENTS

| | | | | |
|---|---|---|---|---|
| 5,744,841 A | * | 4/1998 | Gilbert et al. | 257/360 |
| 6,101,077 A | * | 8/2000 | Matsumoto et al. | 361/111 |
| 6,146,913 A | * | 11/2000 | Rafferty | 438/16 |
| 6,177,324 B1 | * | 1/2001 | Song et al. | 438/307 |
| 6,285,062 B1 | * | 9/2001 | Marr | 257/361 |

* cited by examiner

Primary Examiner—Allan R. Wilson
(74) Attorney, Agent, or Firm—Mikio Ishimaru

(57) ABSTRACT

An electrostatic discharge protection structure is provided with a dielectric gate, source and drain contacts, and a semiconductor substrate. The semiconductor substrate is of a first conductivity type having the dielectric gate disposed partially on its surface. The source and drain contacts are connected to source and drain diffusion regions of a second conductivity type separated by the dielectric gate. Deep source and drain wells of the second conductivity type respectively disposed under the source and drain diffusion regions define a channel region of the first conductivity type. The channel region is doped so that the surface breakdown voltage is exceeded before the subsurface depletion region punch-through voltage is exceeded between the deep source and drain wells upon an electrostatic discharge at the drain contact.

18 Claims, 2 Drawing Sheets

ESD PROTECTION NETWORK WITH FIELD OXIDE DEVICE AND BONDING PAD

TECHNICAL FIELD

The present invention relates to electrostatic discharge (ESD) protection structures and more particularly to ESD protection transistor structures for deep-quarter micron line geometries.

BACKGROUND OF THE INVENTION

Electrostatic discharges (ESDs) are high-voltage spikes of static charges which damage modem integrated circuits. ESDs are a significant failure mechanism, particularly as integrated circuit physical dimensions continue to shrink to the deep-quarter micron range.

Electrically, an ESD occurs upon contact of one or more of the terminals of an integrated circuit with a body or material that is statically charged to a high voltage. This level of static charge is readily generated by the triboelectric effect, and other mechanisms acting upon humans, equipment, or the circuits themselves. Upon contact, the integrated circuit discharges through its active devices and DC current paths. If the amount of charge is excessive however, the discharge current density can permanently damage the integrated circuit so that it is no longer functional or so that it is more prone to later-life failure. ESD damage thus is a cause of yield loss in manufacturing and also poor reliability in use.

In the past, n-type metal oxide semiconductor (NMOS) transistors have been widely used as the primary component in ESD protection circuits in semiconductor integrated circuit devices. Under ESD stress conditions, the NMOS transistor behavior changes drastically from normal operation. The actual conduction mechanism is that of bipolar action in a parasitic lateral bipolar structure.

In advanced manufacturing processes with transistors having lightly doped drain (diffusion) junctions, the NMOS performance is limited because the peak heating occurs close to the surface of the transistor in the silicon which has poor thermal conductivity. Therefore, an ESD implant has to be used to make the junction deeper as well as to overdope the lightly doped region of the diffusion for improved ESD performance. Further, the thin oxide is easily damaged, especially for the ESD paths near the interface of the thin oxide and the p-substrate.

It is also well known that salicidation (self-aligned siliciding) of the drain and source junctions reduces ESD performance significantly due to discharge current localization. From the ESD viewpoint, the primary effect of the salicidation is to bring a transistor drain or a source contact closer to its diffusion edge near their respective gate edge. The consequence is that under high current conditions, the ballasting resistance between the drain or the source contact and their respective gate edge is reduced and the short current path causes "hot spot" formation, usually at the gate edge. Once a hot spot is formed, there is very little resistance to prevent current localization through the hot spot and so most of the current flows through the silicide to the gate edge. This leads to higher power dissipation and damage in this region. Also, the high power dissipation through the drain or source silicide can cause damage at the drain or source contact when the eutectic temperature of the silicide is exceeded.

The most conventional solution to the salicidation problem is called a "salicide block". Most salicidation fabrication technology processes have a "salicide block" option, which is an additional photolithographic process step to block the formation of silicide in areas close to a transistor's gate edge. Without the gate edge silicide, an ESD implantation is required make the drain junction deeper as well as to overdope the lightly doped region of the diffusion for better ESD performance. Since the ESD implantation is undesirable in the integrated circuits being protected, an ESD implant block would be required over the non-ESD circuits. Thus, this approach adds to process complexity because it requires at least two additional photolithographic process steps; i.e., the silicide block and the ESD implant block.

In the parasitic lateral bipolar structure of the NMOS transistor, the majority of the electrons reaching the collector junction are emitted from the emitter junction sidewall of the diffusion region, which results in a very small "intrinsic" base area. The high current is confined to a very small region of the emitter and base regions which leads to a large power density in these regions and hence higher temperatures.

The substrate current initially needs to forward-bias a small region of the source-substrate junction to turn "on" the bipolar action. However, for better ESD performance, a larger emitter area is preferred. This will be particularly effective if the source barrier lowering occurs deeper in the junction, allowing the power dissipation to take place deeper in the device to reduce the temperature rise in the device.

In an ESD transistor, the voltage necessary to turn the transistor "on" is reached before the occurrence of a gate oxide breakdown due to voltage across an internal integrated circuit gate oxide. Unfortunately, as these transistors continue to shrink in size down to the deep-quarter-micron geometry level, the gate oxide becomes so thin that the gate oxide breakdown voltage approaches the turn-on voltage. Thus, the protection window tends to go to zero and at a small enough geometry will provide no protection at all.

Looking back, the field oxide device (FOD) is a better protection element for large feature size technologies since the bipolar action takes place deeper in the silicon and the peak heating is located further away from the silicon surface. However, in advance processes with shallow junctions, the FOD performance is limited and the onset of damage has been observed at low-voltage levels.

Thus, if the turn-on voltage of the FOD could be lower and the snap-back breakdown of the FOD could be controlled to be further away from the silicon surface, the FOD might be again useable to provide ESD protection with a smaller layout area. This ideal has been long sought, but has also equally as long eluded those skilled in the art.

DISCLOSURE OF THE INVENTION

The present invention provides an electrostatic discharge protection structure with a dielectric gate, source and drain contacts, and a semiconductor substrate. The semiconductor substrate is of a first conductivity type having the dielectric gate disposed partially on its surface. The source and drain contacts are connected to source and drain diffusion regions of a second conductivity type separated by the dielectric gate. Deep source and drain wells of the second conductivity type respectively disposed under the source and drain diffusion regions define a channel region of the first conductivity type. The channel region is doped so that the surface breakdown voltage is exceeded before the subsurface depletion region punch-through voltage between the deep source and drain wells upon an electrostatic discharge at the drain contact. The structure is less subject to heat damage and provides excellent ESD protection in a small layout area.

The present invention further provides an electrostatic discharge protection structure with a dielectric gate, source and drain contacts, and a semiconductor substrate connected to a bonding pad on a dielectric layer containing a polysilicon tab and disposed over a floating well in the semiconductor substrate. The semiconductor substrate is of a first conductivity type having the dielectric gate disposed partially on its surface. The source and drain contacts are connected to source and drain diffusion regions of a second conductivity type separated by the dielectric gate. Deep source and drain wells of the second conductivity type respectively disposed under the source and drain diffusion regions define a channel region of the first conductivity type. The channel region is doped so that the surface breakdown voltage is exceeded before the subsurface depletion region punch-through voltage between the deep source and drain wells upon an electrostatic discharge at the drain contact. The structure includes a bonding pad connected to the drain contact and disposed over a dielectric layer containing a polysilicon tab. The dielectric layer in turn is disposed over a floating well in the semiconductor substrate. After wafer probing and wire bonding, the surface of the bonding pad is often punched with holes through the metal layer and have microcracks in the dielectric layer. These holes and microcracks help generate high electrical fields in the damaged dielectric layer and cause metal spiking when a high-voltage ESD is applied to the bonding pad. The polysilicon tab and the floating well provide protection against the ESD induced metal spiking.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
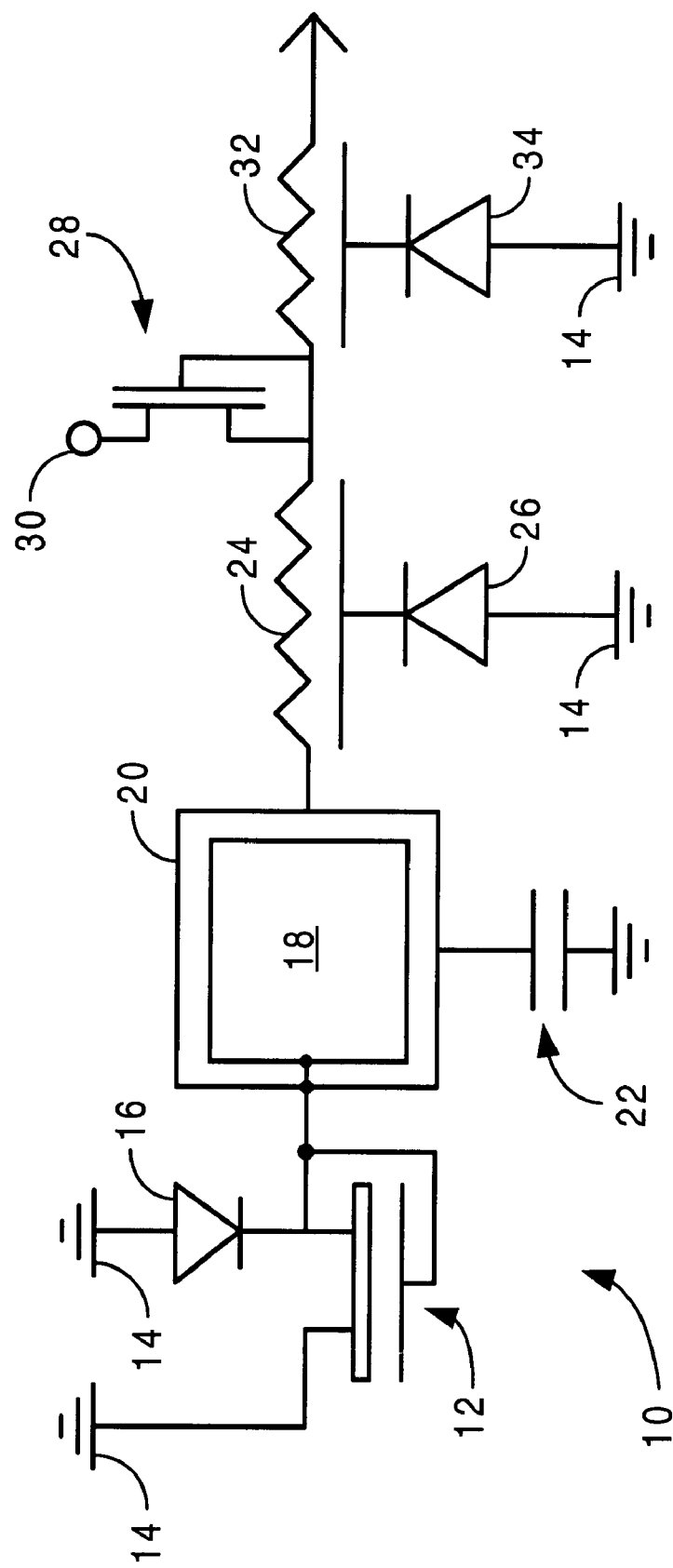
FIG. 1 shows the ESD input protection network of the present invention.

Structure:

Referring now to FIG. 1, therein is shown a circuit schematic of an electrostatic discharge (ESD) protection structure 10. The ESD protection structure 10 includes a low turn-on voltage, field oxide device (FOD) 12 having its source connected to a ground 14, its drain connected through a diode 16 to the ground 14, and its gate connected to its drain.

The drain of the FOD 12 is connected to an input bonding pad 18 and a polysilicon tab 20. The polysilicon tab 20 is disposed over a floating n-well 22 and is capacitively coupled to the ground 14.

The input bonding pad 18 is further connected to a first attenuation resistor 24 which is capacitively coupled by a first diode 26 to the ground 14.

The first attenuation resistor 24 is connected to the drain and gate of a power supply discharge transistor 28 which has its source connected to a power supply (Vdd) line 30. The drain and gate of the power supply discharge transistor 28 is further connected to a second attenuation resistor 32 which is capacitively coupled by a second diode 34 to the ground 14. The second attenuation resistor 32 is then connected to the input of the integrated circuits (not shown) which is to be protected by the ESD protection structure 10.

Figure 2:
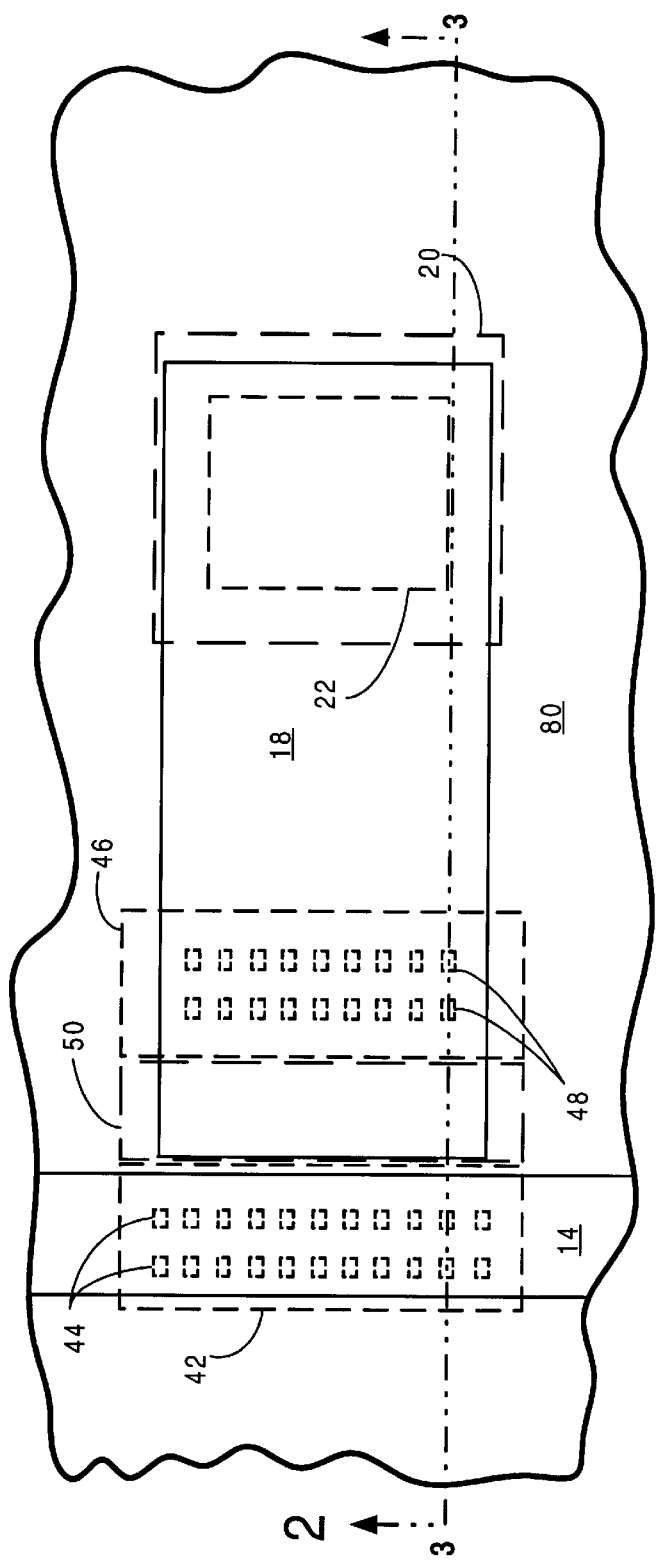
FIG. 2 shows a schematic plan view of the field oxide device of the present invention.

Referring now to FIG. 2, therein is shown a plan view of a portion of the ESD protection structure 10 looking down at the horizontal surface of a portion of a silicon semiconductor substrate 40.

The term "horizontal" as used in herein is defined as a plane parallel to the conventional plane or surface of the semiconductor substrate 40, regardless of the orientation of the semiconductor substrate 40. The term "vertical" refers to a direction perpendicular to the horizontal as just defined. Prepositions, such as "on", "below", "above", "beneath", "lower", "over", and "under" are defined with respect to the conventional plane or surface being on the top surface of the semiconductor substrate 40, regardless of the orientation of the semiconductor substrate 40.

In FIG. 2, are shown the FOD 12 and the input bonding pad 18. The FOD 12 is shown with the source 42 connected by a plurality of source contacts 44 to the ground 14. Also shown is the drain 46 of the FOD 12 connected by a plurality of drain contacts 48 to the input bonding pad 18. A p-doped channel region 50 of the FOD 12 is shown under a polysilicon gate 52.

Figure 3:
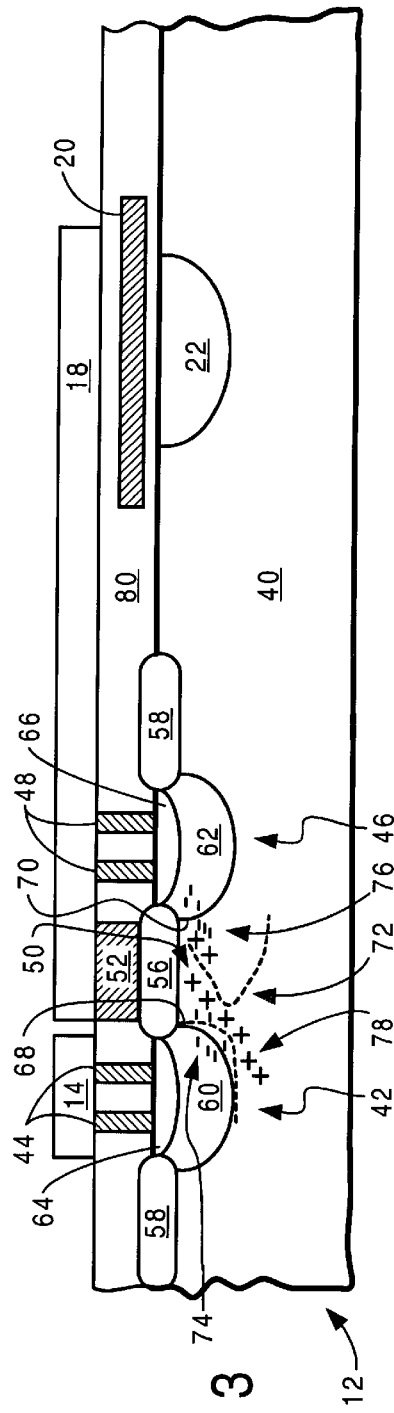
FIG. 3 shows a schematic cross-section of the field oxide device of the present invention in operation.

Referring now to FIG. 3, therein is shown a cross-section of FIG. 2 taken along the line 3—3. The FOD 12 has a field oxide (FOX) 56 deposited over the p-doped channel region 50 and the polysilicon gate 52 deposited above the p-doped channel region 50. Implanted into the semiconductor substrate 40 between the FOX 56 and an isolation FOX 58 are deep n-wells 60 and 62 and respective n+0 regions 64 and 66. The n-wells 60 and 62 are referred to as being deep because they are at least twice as deep as the respective n+ diffusion regions 64 and 66.

The deep n-wells 60 and 62 make up the emitter and collector junctions of a parasitic lateral bipolar structure and the p-doped channel region 50 the base area. Respective sidewalls of the deep n-wells 60 and 62 form large parasitic "intrinsic" emitter and collector areas 68 and 70 and the length of the p-doped channel region 50 or base area between the parasitic "intrinsic" emitter and collector areas 68 and 70 define the parasitic "intrinsic" base length.

The n-well 60 and the n+ diffusion region 64 form the source 42 and the n-well 62 and the n+ diffusion region 66 form the drain 46. Above the n+ diffusion region 64 and n+ diffusion region 66 are respective source and drain contacts 44 and 48.

The depletion region of the drain 46 is shown as subsurface depletion region 72.

A light ion implantation is used to set the surface doping profile of the p-doped channel region 50 to be of an opposite conductivity (p-) to that of the source 42 and the drain 46 and to have the effect of reducing the breakdown voltage of the parasitic "intrinsic" collector area 70. The breakdown voltage is chosen to be in the subsurface region near the parasitic "intrinsic" collector area 70 to provide an ideal low-trigger voltage so that the surface breakdown under the polysilicon gate 52 and subsurface depletion region 72 punch-through can occur at the same time.

The region where electrons are ejected when the source 42 is forward biased is shown as an electron ejection region 74. The region where electron-hole generation occurs due to impact ionization is designated as the hole generation region 76 and an arrow designates the direction of the hole current 78.

Adjacent to the FOD 12 is shown the input bonding pad 18 disposed on a dielectric layer 80, generally two layers of silicon oxide, in which the polysilicon tab 20 is disposed.

The dielectric layer 80 is deposited on the semiconductor substrate 40 over the floating n-well 22.

Field Oxide Device Operation:

In operation, the ESD protection structure 10 with the FOD 12 and the bonding pad 18 is provided at the input to the integrated circuits to protect against major ESDs and relieve ESD stress on the integrated circuits located after the first and second attenuation resistors 24 and 32.

In the beginning stages of an ESD event, the charge at the bonding pad 18 is conducted to the drain 46 of the FOD 12. A high electric field intensity is established across the parastic "intrinsic" collector area 70, resulting in an impact ionization phenomenon which produces electron holes 76. The holes are responsible for a local electric potential established in the p-doped channel region 50 and the semiconductor substrate 40 which cause the hole current 78. When the electric potential accumulated in this region becomes significantly higher than that of the potential of the source 42, the source 42 becomes forward biased. This forward bias then injects the electrons into the p-doped channel region 50 and the semiconductor substrate 40. As the injected electrons further increase the effect of impact ionization, the FOD 12 eventually enters a low-resistance (snap-back) state, and the excessive ESD current is then released.

As the current flowing from the drain to the source increases, current constriction eventually arises, forcing the ESD current to travel along several narrow passages between the drain and the source junctions, flowing through the weakest spots beneath the FOX 56. High current density flowing along the narrowed and constricted discharge passages inevitably leads to excessive heating, and regions in the FOD 12 where the temperature rises above the melting point of silicon or conductor material would then suffer permanent damage, particularly in the silicon substrate or at the contacts.

As a result, when an ESD pulse is conducted at the drain 46, the onset of the parasitic bipolar action for the FOD 12 is determined by the n+ drain diffusion avalanche breakdown. The breakdown near the parasitic "intrinsic" collector area 70 of the drain 46 occurs at a low value and deep in the semiconductor substrate 40. The trigger voltage and the snap-back holding voltage of the FOD 12 will be low with the trigger voltage slightly lower than the snap-back holding voltage. After the breakdown in the parasitic "intrinsic" collector area 70, the hole current 78 will be injected into the semiconductor substrate 40 and produce a potential which will make the parasitic "intrinsic" emitter area 68 to become forward biased so as to eject electrons from the electron ejection region 74. The breakdown occurs with the generation of electron-hole pairs, and the generated electrons are swept across the drain 46 towards the drain contacts 48 adding to the drain current. The generated holes drift towards the substrate contact (not shown) giving rise to the hole current 78, similar to the base current for a bipolar transistor.

With the large parasitic "intrinsic" emitter and collector areas 68 and 70, and the source barrier lowering occurring deep in the source 42, the power dissipation takes place in a large volume deep in the FOD 12 in the area of the subsurface depletion region 72 with a low temperature rise in the FOD 12 because the silicon in the semiconductor substrate 40 can conduct heat away. The subsurface depletion region 72 also lowers the source barrier (drain induced barrier lowering or DIBL) near the punch-through voltage.

The deep n-wells 60 and 62 provide deep junctions with relatively smooth curvatures so that high-level ESDs may be handled.

Further, the deep n-wells prevent metal spiking from the source and drain contacts 44 and 48 from reaching the respective bottoms of the deep n-wells 60 and 62, nor can the metal spiking microdiffuse under the polysilicon gate 52. This prevents junction leakage as happened in the past with shallow junction devices.

By keeping the length of the p-doped channel region 50 short, the bipolar turn-on time of the FOD 12 is the base transit time and can be kept short to provide highly responsive ESD protection. The length is controlled by both the profiling of the implantations as well as the depth control.

Under ESD inducing parasitic bipolar snap-back, the FOX 56 of the present invention is at least twice the depth of the n+ diffusion region and cannot be easily ruptured.

Bonding Pad Operation:

After wafer probing and wire bonding, the surface of the bonding pad 18 are often punched with holes through the metal layer and have microcracks in the dielectric layer 80. These holes and microcracks help generate high electrical fields in the damaged dielectric layer 80 when a high-voltage ESD is applied to the bonding pad 18. If the electrostatic charge cannot be quickly discharged to the semiconductor substrate 40 or Vdd line 30 due to the first attenuation resistor 24 and the diode 16, the dielectric layer 80 can be ruptured. When the dielectric layer 80 is ruptured, leakage paths of metal alloy can be formed from the bonding pad 18 through microcracks to the semiconductor substrate 40. To protect the bonding pad 18, the floating n-well 22, with a conductivity type opposite the semiconductor substrate 40 is placed under the input bonding pad 18 as an extra protection against the ESD induced metal spiking.

In the present invention, the polysilicon tab 20 is added and acts as a buffer between the input bonding pad 18 and the floating n-well 22 and is connected to the gate of the FOD 12. The polysilicon tab 20 does not prevent alloying, but it increases the distance that an alloyed spike must travel before a leakage path can occur. Thus, the possibility of a metal spike making contact between the input bonding pad 18 and the semiconductor substrate 40 is drastically reduced. Also, the resulting series capacitance from the input bonding pad 18 to the semiconductor substrate 40 makes the entire pad capacitance less than its capacitance without the polysilicon tab 20 and improves the speed of the integrated circuit.

In the present invention, the ESD charge can couple to the floating n-well 22 and offload part of the ESD energy from the integrated circuits. For a negative charge, the floating n-well 22 discharges the energy through the forward bias junction to the semiconductor substrate 40. However, for positive charges, the floating n-well 22 must discharge the coupled energy or it will have less absorbing power to handle multiple ESDs and its own junction could be stressed for too long and suffer damage. In order to relieve the charge from the floating n-well 22, bipolar punch-through structures are used to discharge the positive ESD charge to the ground.

The present invention further uses multiple contacts 44 and 48 which enlarge the contact perimeter so that the discharge current can be spread more evenly. Each contact can be used as part of the "balasting" to prevent current crowding and there is less metal available for alloying, hence junction spiking is minimized. In order to reduce contact heating, the contacts are designed with a large contact area for reducing current density and form for avoiding non-uniform current flow.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An electrostatic discharge protection structure comprising:

a gate dielectric;

source and drain contacts; and a semiconductor substrate of a first conductivy type having the gate dieletric disposed partlly therein on a surfce thereof, the semiconductor substrate having the source and drain contacts on the surface thereof separated by the gate dielectric, the semiconductor substrate having source and drain diffusion. regions having a second conductivity type and connected respectively to the source and drain contacts and separated by the gate dielectric, the semiconductor substrate having source and drain wells having the second conductivity type and respectively disposed under the source and drain diffusion regions, the semiconductor substrate having a channel region of the first conductivity type between the source and drain wells including a subsurface depletion region whereby the surface breakdown voltage is exceeded before the subsurface depletion region punch-through voltage is exceeded upon an electrostatic discharge at the drain contact and the semiconductor substrate including a subsurface conductivity region of the first conductivity type of a higher doping concentration than the doping concentration in the semiconductor substrate between the source and drain wells.

2. The electrostatic discharge protection structure as claimed in claim 1 including a gate disposed over the gate dielectric.

3. The electrostatic discharge protection structure as claimed in claim 1 wherein the gate dielectric is thicker flan the depth of the source and drain diffusion regions.

4. The electrostatic discharge protection structure as claimed in claim 1 wherein:

the source and drain wells are more than twice the depth of the source and drain diffusion regions.

5. The electrostatic discharge protection structure as claimed in claim 1 wherein:

the source and the drain wells are spaced proximate each other.

6. The electrostatic discharge protection structure as claimed in claim 1 including:

a ground;

a diode; and wherein:

the source contact is connected to the ground; and the drain contact is connected to the ground through the diode.

7. The electrostatic discharge protection structure as claimed in claim 1 including:

a bonding pad connected to the drain contact;

a dielectric layer under the bonding pad and disposed on the semiconductor substrate;

a tab disposed in the dielectric layer under the bonding pad; and a well of a second conductivity type disposed beneath the dielectric material in the semiconductor substrate.

8. The electrostatic discharge protection structure as claimed in claim 1 including:

a gate disposed over the gate dielectric;

a bonding pad;

a tab disposed beneath the bonding pad and connected to the gate;

a dielectric material surrounding the tab and disposed over the semiconductor substrate; and a well of a second conductivity type disposed beneath the dielectric material in the semiconductor substrate.

9. The electrostatic discharge protection structure as claimed in claim 2 including;

a power supply connection;

a ground connection a bonding pad connected to the drain contact;

a first attenuation resistor connected to the bonding pad;

a first diode capacitively connecting the first attenuation resistor to the ground connection;

a transistor having the gate and source thereof connected to the first attenuation resistor and the drain thereof connected to the power supply line;

a second attenuation resistor connected to the first attenuation resistor and having an input connection; and a second diode capacitively conning the second attenuation resistor to the ground connection.

10. An electrostatic discharge protection structure comprising:

a field oxide, source and drain contacts; and a p-doped silicon substrate having the field oxide disposed partially therein on a surface thereof, the silicon substrate having the source and drain contacts on the surface thereof separated by the field oxide, the silicon substrate having source and drain n+ diffusion regions and connected respectively to the source and drain contacts and separated by the field oxide, the silicon substrate having source and drain n+ wells and respectively disposed under the source and drain diffusion regions, the silicon substrate having a channel region between the source and drain wells including a subsurface depletion region whereby the surface breakdown voltage is exceeded before the subsurface depletion region punch-through voltage is exceeded upon an electrostatic discharge at the drain contact, and the silicon substrate including a p-subsurface region of a higher p-doping concentration than the p-doping concentration in the silicon substrate between the source. and drain wells.

11. The electrostatic discharge protection structure as claimed in claim 10 including a polysilicon gate disposed over the field oxide.

12. The electrostatic discharge protection structure as claimed in claim 10 wherein the field oxide is thicker than the depth of the source and drain. diffusion regions.

13. The electrostatic discharge protection structure as claimed in claim 12 wherein:

source and drain wells are at least twice the depth of the source and drain diffusion regions and the source and drain contacts are a plurality of smaller contacts.

14. The electrostatic discharge protection structure as claimed in claim 10 wherein:

the source and the drain wells are spaced proximate each other.

15. The electrostatic discharge protection structure as claimed in claim 10 including:

a ground;

a diode; and wherein:
the source contact is connected to the ground; and
the drain contact is connected to the ground through the diode.

16. The electrostatic discharge protection structure as claimed in claim 10 including:

a bonding pad connected to the drain contact;

a dielectric layer under the bonding pad and disposed on the silicon substrate;

a tab disposed in the dielectric layer under the bonding pad; and a floating n-well disposed beneath the dielectric material in the silicon substrate.

17. The electrostatic discharge protection structure as claimed in claim 10 including:

gate disposed over the field oxide;

a bonding pad;

a tab disposed beneath the bonding pad and connected to the gate;

a dielectric material surrounding the tab and disposed over the silicon substrate, and a floating n-well disposed beneath the dielectric material in the silicon substrate.

18. The electrostatic discharge protection structure as claimed in claim 10 including:

a power supply connection;

a ground connection a bonding pad connected to the drain contact;

a first attenuation resistor connected to the bonding pad;

a first diode capacitively connecting the first attenuation resistor to the ground connection;

a transistor having the gate and source thereof connected to the first attenuation resistor and the drain thereof connected to the power supply line;

a second attenuation resistor connected to the first attenuation resistor and having an input connection; and a second diode capacitively connecting the second attenuation resistor to the ground connection.

\* \* \* \* \*

UNITED STATES PATENT AND TRADEMARK OFFICE
CERTIFICATE OF CORRECTION

PATENT NO. : 6,417,541 B1
DATED : July 9, 2002
INVENTOR(S) : Cai et al.

It is certified that error appears in the above-identified patent and that said Letters Patent is hereby corrected as shown below:

Column 1,
Line 13, delete "modem" and insert therefor -- modern --.

Column 7,
Line 13, delete "conductivy" and insert therefor -- conductivity --.
Line 14, delete "partlly" and insert therefor -- partially --.
Line 15, delete "surfce" and insert therefor -- surface --.
Line 30, delete "contact" and insert therefor -- contact, --.
Line 40, delete "flan" and insert therefor -- than --.

Column 8,
Line 13, delete "2" and insert therefor --1 --.
Line 25, delete "conning" and insert therefor -- connecting --.
Line 58, delete "12" and insert -- 10 --.

Signed and Sealed this

Twelfth Day of November, 2002

Attest:

JAMES E. ROGAN
Attesting Officer
Director of the United States Patent and Trademark Office